United States Patent
Harari et al.

(10) Patent No.: US 7,447,069 B1
(45) Date of Patent: Nov. 4, 2008

(54) FLASH EEPROM SYSTEM

(75) Inventors: Eliyahou Harari, Los Gatos, CA (US);
Robert D. Norman, San Jose, CA (US);
Sanjay Mehrotra, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 09/064,250

(22) Filed: Apr. 22, 1998

Related U.S. Application Data

(60) Continuation of application No. 08/931,133, filed on Sep. 16, 1997, now Pat. No. 5,936,971, which is a continuation of application No. 08/249,049, filed on May 25, 1994, now Pat. No. 5,671,229, which is a continuation of application No. 07/963,837, filed on Oct. 20, 1992, now abandoned, which is a division of application No. 07/337,566, filed on Apr. 13, 1989, now abandoned.

(51) Int. Cl.
*G11C 16/04* (2006.01)
(52) U.S. Cl. .............................. 365/185.11; 365/185.09
(58) Field of Classification Search ............ 365/185.11, 365/185.09, 185.08
See application file for complete search history.

(56) References Cited

U.S. PATENT DOCUMENTS

| | | | |
|---|---|---|---|
| 3,633,175 A | 1/1972 | Harper | 340/172.5 |
| 3,676,877 A | 7/1972 | Kobayashi | |
| 3,778,776 A | 12/1973 | Hakozaki | |
| 3,806,883 A | 4/1974 | Weisbecker | |
| 3,894,347 A | 7/1975 | Sleven et al. | |
| 3,938,097 A | 2/1976 | Niguette, III | |
| 3,949,368 A | 4/1976 | West | |
| 4,037,209 A | 7/1977 | Nakajima et al. | |
| 4,051,354 A | 9/1977 | Choate | |
| 4,090,258 A | 5/1978 | Cricchi | |
| 4,149,270 A | 4/1979 | Cricchi et al. | |

(Continued)

FOREIGN PATENT DOCUMENTS

AU          0557723          1/1987

(Continued)

OTHER PUBLICATIONS

Torelli et al., "An Improved Method for Programming a Word-Erasable EEPROM", Alta Frequenza, vol. 52, Nov.-Dec. 1983, No. 6, pp. 487-494.

(Continued)

*Primary Examiner*—Vu A Le
(74) *Attorney, Agent, or Firm*—Davis Wright Tremaine LLP

(57) ABSTRACT

A system of Flash EEprom memory chips with controlling circuits serves as non-volatile memory such as that provided by magnetic disk drives. Improvements include selective multiple sector erase, in which any combinations of Flash sectors may be erased together. Selective sectors among the selected combination may also be de-selected during the erase operation. Another improvement is the ability to remap and replace defective cells with substitute cells. The remapping is performed automatically as soon as a defective cell is detected. When the number of defects in a Flash sector becomes large, the whole sector is remapped. Yet another improvement is the use of a write cache to reduce the number of writes to the Flash EEprom memory, thereby minimizing the stress to the device from undergoing too many write/erase cycling.

5 Claims, 5 Drawing Sheets

U.S. PATENT DOCUMENTS

| | | |
|---|---|---|
| 4,181,980 A | 1/1980 | McCoy |
| 4,188,662 A | 2/1980 | Ishibashi |
| 4,219,883 A | 8/1980 | Kobayashi et al. |
| 4,250,570 A | 2/1981 | Tsang et al. |
| 4,253,059 A | 2/1981 | Bell et al. |
| 4,272,830 A | 6/1981 | Moench |
| 4,279,024 A | 7/1981 | Schrenk ............... 365/203 |
| 4,281,398 A | 7/1981 | McKenny et al. |
| 4,287,570 A | 9/1981 | Stark |
| 4,296,930 A | 10/1981 | Fredericksen |
| 4,297,719 A | 10/1981 | Hsu |
| 4,354,253 A | 10/1982 | Naden |
| 4,355,376 A | 10/1982 | Gould ............... 365/209 |
| 4,380,066 A | 4/1983 | Spencer et al. |
| 4,393,475 A | 7/1983 | Kitagawa et al. |
| 4,405,952 A | 9/1983 | Slakmon |
| 4,414,644 A | 11/1983 | Tayler |
| 4,415,992 A | 11/1983 | Adlhoch |
| 4,422,161 A | 12/1983 | Kressel et al. |
| 4,442,488 A | 4/1984 | Hall |
| 4,450,559 A | 5/1984 | Bond et al. |
| 4,459,661 A | 7/1984 | Kaneda et al. |
| 4,460,982 A | 7/1984 | Gee et al. |
| 4,463,450 A | 7/1984 | Haeusele |
| 4,466,055 A | 8/1984 | Kinoshita et al. |
| 4,475,194 A | 10/1984 | LaValee et al. |
| 4,479,214 A | 10/1984 | Ryan |
| 4,482,952 A | 11/1984 | Akagi |
| 4,491,836 A | 1/1985 | Collmeyer et al. |
| 4,493,075 A | 1/1985 | Anderson et al. |
| 4,495,602 A | 1/1985 | Sheppard |
| 4,498,146 A | 2/1985 | Martinez |
| 4,503,518 A | 3/1985 | Iwahashi |
| 4,514,830 A | 4/1985 | Hagiwara et al. |
| 4,525,839 A | 6/1985 | Nozawa et al. |
| 4,527,251 A | 7/1985 | Nibby, Jr. et al. |
| 4,530,054 A | 7/1985 | Hamstra et al. |
| 4,550,367 A | 10/1985 | Hattori et al. |
| 4,563,752 A | 1/1986 | Pelgrom et al. |
| 4,586,163 A | 4/1986 | Koike |
| 4,587,629 A | 5/1986 | Dill et al. |
| 4,601,031 A | 7/1986 | Walker et al. |
| 4,612,629 A | 9/1986 | Harari |
| 4,612,640 A | 9/1986 | Mehrotra et al. |
| 4,615,020 A | 9/1986 | Rinerson et al. |
| 4,616,311 A | 10/1986 | Sato ............... 369/200 |
| 4,617,651 A | 10/1986 | Ip et al. |
| 4,654,847 A | 3/1987 | Dutton ............... 371/10 |
| 4,661,929 A | 4/1987 | Aoki et al. |
| 4,672,240 A | 6/1987 | Smith et al. |
| 4,677,590 A | 6/1987 | Arakawa |
| 4,685,082 A | 8/1987 | Cheung |
| 4,688,219 A | 8/1987 | Takemae |
| 4,718,041 A | 1/1988 | Baglee et al. |
| 4,733,394 A | 3/1988 | Giebel ............... 371/21 |
| 4,746,998 A | 5/1988 | Robinson et al. |
| 4,748,320 A | 5/1988 | Yorimoto et al. |
| 4,751,638 A | 6/1988 | Azuma |
| 4,751,678 A | 6/1988 | Raghunathan |
| 4,752,929 A | 6/1988 | Kantz |
| 4,757,474 A | 7/1988 | Fukushi et al. |
| 4,768,193 A | 8/1988 | Takemae |
| 4,774,652 A | 9/1988 | Dhuey et al. |
| 4,774,700 A | 9/1988 | Satoh et al. |
| 4,779,272 A | 10/1988 | Kohda et al. |
| 4,791,499 A | 12/1988 | Mester |
| 4,794,568 A | 12/1988 | Lim et al. |
| 4,796,233 A | 1/1989 | Awaya et al. |
| 4,799,195 A | 1/1989 | Iwahashi et al. |
| 4,807,188 A | 2/1989 | Casagrande |
| 4,809,231 A | 2/1989 | Shannon et al. |
| 4,811,291 A | 3/1989 | de Ferron |
| 4,811,294 A | 3/1989 | Kobayashi et al. |
| 4,814,976 A | 3/1989 | Hansen et al. |
| 4,819,211 A | 4/1989 | Takagi |
| 4,827,452 A | 5/1989 | Toyama et al. |
| 4,841,482 A | 6/1989 | Kreifels et al. |
| 4,847,808 A | 7/1989 | Kobatake |
| 4,849,938 A | 7/1989 | Furutani et al. |
| 4,862,416 A | 8/1989 | Takeuchi |
| 4,870,618 A | 9/1989 | Iwashita |
| 4,872,138 A | 10/1989 | Ciacci |
| 4,896,262 A | 1/1990 | Wayama et al. |
| 4,899,272 A | 2/1990 | Fung et al. |
| 4,914,529 A | 4/1990 | Bonke |
| 4,916,605 A | 4/1990 | Beardsley et al. |
| 4,920,518 A | 4/1990 | Nakamura et al. |
| 4,924,331 A | 5/1990 | Robinson et al. |
| 4,924,375 A | 5/1990 | Fung et al. |
| 4,933,906 A | 6/1990 | Terada et al. |
| 4,939,690 A | 7/1990 | Momodomi et al. |
| 4,942,556 A | 7/1990 | Sasaki et al. |
| 4,943,962 A | 7/1990 | Imamiya et al. |
| 4,945,535 A | 7/1990 | Hosotani et al. ............ 371/11.1 |
| 4,949,309 A | 8/1990 | Rao |
| 4,953,122 A | 8/1990 | Williams |
| 4,956,816 A | 9/1990 | Atsumi et al. |
| 4,959,812 A | 9/1990 | Momodomi et al. |
| 4,969,122 A | 11/1990 | Jensen |
| 4,980,861 A | 12/1990 | Herdt et al. |
| 4,996,669 A | 2/1991 | Endoh et al. |
| 4,999,813 A | 3/1991 | Ohtsuka et al. |
| 5,003,510 A | 3/1991 | Kamisaki |
| 5,022,001 A | 6/1991 | Kowalski et al. |
| 5,033,990 A | 7/1991 | Silverman |
| 5,034,922 A | 7/1991 | Burgess |
| 5,043,940 A | 8/1991 | Harari |
| 5,051,887 A | 9/1991 | Berger et al. ............... 364/200 |
| 5,053,990 A | 10/1991 | Kreifels et al. |
| 5,065,364 A | 11/1991 | Atwood et al. |
| 5,095,344 A | 3/1992 | Harari ............... 357/23.5 |
| 5,123,016 A | 6/1992 | Muller et al. |
| 5,134,616 A | 7/1992 | Barth, Jr. et al. |
| 5,163,021 A | 11/1992 | Mehrotra et al. ............ 365/185 |
| 5,168,465 A | 12/1992 | Harari |
| 5,172,338 A | 12/1992 | Mehrotra et al. ............ 365/165 |
| 5,198,380 A | 3/1993 | Harari |
| 5,226,168 A | 7/1993 | Kobayashi et al. ............ 395/820 |
| 5,245,572 A | 9/1993 | Kosonocky et al. |
| 5,263,003 A | 11/1993 | Cowles et al. |
| 5,267,218 A | 11/1993 | Elbert |
| 5,268,318 A | 12/1993 | Harari |
| 5,268,319 A | 12/1993 | Harari |
| 5,268,870 A | 12/1993 | Harari |
| 5,280,447 A | 1/1994 | Hazen et al. |
| 5,295,255 A | 3/1994 | Malecek et al. |
| 5,297,148 A | 3/1994 | Harari et al. |
| 5,341,489 A | 8/1994 | Heiberger et al. |
| 5,357,462 A | 10/1994 | Tanaka |
| 5,357,473 A | 10/1994 | Mizuno et al. |
| 5,361,227 A | 11/1994 | Tanaka et al. |
| 5,369,616 A | 11/1994 | Wells et al. |
| 5,418,752 A | 5/1995 | Harari et al. ............... 365/218 |
| 5,488,711 A | 1/1996 | Hewitt et al. |
| 5,530,673 A | 6/1996 | Tobita et al. |
| 5,541,886 A | 7/1996 | Hasbun |
| 5,544,119 A | 8/1996 | Wells et al. |
| 5,546,348 A | 8/1996 | Honma et al. |
| 5,594,691 A | 1/1997 | Bashir |
| 5,602,987 A | 2/1997 | Harari et al. |
| 5,627,783 A | 5/1997 | Miyauchi ............... 365/185.33 |
| 5,630,093 A | 5/1997 | Holzhammer et al. |
| 5,644,539 A | 7/1997 | Yamagami et al. |
| 5,657,270 A | 8/1997 | Ohuchi et al. |

| | | | |
|---|---|---|---|
| 5,687,114 A | 11/1997 | Khan |
| 5,740,349 A | 4/1998 | Hasbun et al. |
| 5,793,696 A | 8/1998 | Tanaka et al. |
| 5,802,551 A | 9/1998 | Komatsu et al. |
| 5,802,554 A | 9/1998 | Caceres et al. |
| 5,818,754 A | 10/1998 | Ogura |
| 5,826,083 A | 10/1998 | Prasad |
| 5,831,903 A | 11/1998 | Ohuchi et al. |
| 5,933,366 A | 8/1999 | Yoshikawa |
| 5,933,852 A | 8/1999 | Jeddeloh |
| 5,987,573 A | 11/1999 | Hiraka |
| 5,991,517 A | 11/1999 | Harari et al. |
| 5,999,446 A | 12/1999 | Harari et al. |
| 5,999,476 A | 12/1999 | Dutton et al. |
| 6,014,327 A | 1/2000 | Banks |
| 6,069,827 A | 5/2000 | Sinclair |
| 6,128,224 A | 10/2000 | Morton et al. |
| 6,130,837 A | 10/2000 | Yamagami et al. |
| 6,344,998 B2 | 2/2002 | Banks |
| 6,356,486 B1 | 3/2002 | Banks |
| 6,381,172 B2 | 4/2002 | Banks |
| 6,404,675 B2 | 6/2002 | Banks |

FOREIGN PATENT DOCUMENTS

| | | |
|---|---|---|
| DE | 2840305 | 3/1980 |
| DE | 3200872 | 7/1983 |
| DE | 3637682 | 5/1987 |
| DE | 3831538 | 3/1989 |
| EP | 0086886 | 8/1983 |
| EP | 0220718 | 5/1987 |
| EP | 0243503 | 11/1987 |
| EP | 0300264 | 1/1989 |
| EP | 0392895 | 10/1990 |
| EP | 0492106 | 7/1992 |
| EP | 0522780 | 1/1993 |
| EP | 0569040 | 11/1993 |
| EP | 0615193 | 9/1994 |
| GB | 2029145 | 3/1980 |
| GB | 2061651 | 5/1981 |
| GB | 2136992 | 9/1984 |
| GB | 2251323 | 7/1992 |
| GB | 2251324 | 7/1992 |
| JP | 5931158 | 7/1984 |
| JP | 59-144098 | 8/1984 |
| JP | 60178564 | 9/1985 |
| JP | 60179857 | 9/1985 |
| JP | 61-184795 | 8/1986 |
| JP | 62188100 | 8/1987 |
| JP | 62283496 | 12/1987 |
| JP | 63-055799 | 3/1988 |
| JP | 63-117400 | 5/1988 |
| JP | 63-124298 | 5/1988 |
| JP | 36316259 A | 6/1988 |
| JP | 63-308797 | 12/1988 |
| JP | 0123878 | 5/1989 |
| JP | 1235075 | 9/1989 |
| JP | 0146949 | 10/1989 |
| JP | 2189790 | 7/1990 |
| JP | 2292798 | 12/1990 |
| JP | 3025798 | 2/1991 |
| JP | 3030034 | 2/1991 |
| JP | 3283094 | 12/1991 |
| JP | 4123243 | 4/1992 |
| JP | 4243096 | 8/1992 |
| JP | 4028039 | 1/1993 |
| JP | 5027924 | 2/1993 |
| JP | 5204561 | 8/1993 |
| JP | 5241741 | 9/1993 |
| WO | 8400628 | 2/1984 |
| WO | 9218928 | 10/1992 |
| WO | 9311491 | 6/1993 |

OTHER PUBLICATIONS

Alberts et al., "Multi-Bit Storage Fet Earom Cell", IBM Technical Disclosure Bulletin, vol. 24, No. 7A, Dec. 1981, pp. 3311-3314, 4193.

Berenga et al. "E2-PROM TV Synthesizer", 1978 IEEE International Solid-State Circuits Conference: ISCCC 78, Feb. 17, 1978, pp. 196-197.

"Bipolar/MOS Memories Data Book", *Advanced Micro Devices*, ISSN 0888-4714, pp. 6-1-6-14, 1986.

Bleiker et al., "A Four State EEPROM Using Floating-Gate Memory Cells", IEEE Journal of Solid-State Circuits, vol. Sc-22. No. 3, Jun. 1987, pp. 460-463.

Caironi et al., "A TV Frequency Synthesis System With a Single Chip Microprocessor Interface Including Non-Volatile Memory", IEEE Transactions on Consumer Electronics, vol. CE-28, No. 3, pp. 363-371, Aug. 1982.

Furuyama et al., "An Experimental 2-BIT/CELL Storage Dram for Macro Cell or Memory-on-Logic Application", IEEE Custom Integrated Circuits Conference, May 1988, pp. 4.4.1-4.4.4.

Gee et al., "An Enhanced 16K E2PROM", IEEE Journal of Solid-State Circuits, vol. SC-17, No. 5, Oct. 1982, pp. 828-832.

Horiguchi et al. "An Experimental Large-Capacity Semiconductor File Memory Using 16-Level/Cell storage", IEEE Journal of Solid-State Circuits, vol. 23, Feb. 1998, No. 1, pp. 27-33.

IBM Technical Dislcosure Bulletin "EPROMgramming Device", vol. 29, No. 9, Feb. 1987, pp. 4145-4146.

Japanese Office Action (with translation), Application No. 123842/1999 for SanDisk Corporation, dated Sep. 20, 2005, 5 pages.

Krick, "Three-State MNOS FET Memory Array", IBM Technical Disclosure Bulletin, vol. 18, No. 12, May 1976, pp. 4192-4193.

Kynett et al., "A 90-ns One Million Erase/Program Cycle 1-Mbit Flash Memory", IEEE Journal of Solid-State Circuits, vol. 24, No. 5, Oct. 1989, pp. 1259-1263.

Kynett et al. "An In-System Reprogrammable 32K X 8 CMOS Flash Memory", IEEE Journal of Solid-State-Circuits, vol. 23, No. 5, Log No. 8822443, Oct. 1988, pp. 1157-1163.

Klingman, "Microprocessor Systems Design", Prentice-Hall, Inc. pp. 30-31, 1977.

Masuoka et al. "A 256-KBIT Flash EEPROM Using Triple-Polysilicon Technology", IEEE Journal of Solid-State Circuits, vol. SC-22, No. 4, pp. 548-522, New York, USA, Aug. 1987.

SGS-ATES "Excerpts From a 1983 Data Book", SGS-Ates Group, 45 pp., Nov. 1983.

SGS-ATES. "PLL TV Microcomputer interface", SGA-ATES, MOS Integrated Circuits/M206, 15 pp. Jun. 1982.

Scrocchi et al. "EPM32-Electronic Program Memory System for TV (32 stations)" SGS-ATES, Technical Note#153, pp. 1-19, 1982.

SEEQ Data Book 1988-89 SEEQ Technology, Inc. pp. 3-1-3-7.

Stark, "Two Bits Per Cell ROM", Digest of Papers Spring COMCONS 81, Feb. 23-26, VLSI Laboratory, pp. 209-212.

Tanaka et al., "A 4-Mbit NAND-EEPROM with Tight Programmed Vt Distribution", 1990 Symposium on VLSI Circuits, Digest of Technical Papers, pp. 105-106.

Torelli, "An LSI Technology Fully Compatible EAROM Cell", Componente Electronic SpA, No. 6, vol. LI, 7 pp. 1982.

Torelli et al., "Intergrating Non-Volatile Station Memory and Remote Control Receiver in a Single Chip", IEEE Digest of Technical Papers, CAT. No.: 83CH1872-1, 2 pp., Jun. 8, 1983.

Torelli et al., "Non-Volatile Station Memory and Remote-Control Receiver and Memory Display Driver", IEEE Transactions on Consumer Electronics, vol. CE-29, No. 3, pp. 103-113, Aug. 1983.

Torelli et al., PLL2K-PLL Frequency Synthesizer for 30 Programs, SGS-ATES, Technical Note #152, pp. 1-16, 1982.

Torelli et al. "Single Chip, 16 Station TV Digital Tuning System", SGS Technical Note #170, pp. 1-19, 1984.

USPTO, "Office Action," mailed in related U.S. Appl. No. 10/417,954 on Jan. 19, 2007, 11 pages.

USPTO, "Office Action," mailed in related U.S. Appl. No. 09/759,119 on Jan. 19, 2007, 6 pages.

USPTO, "Office Action," mailed in related U.S. Appl. No. 09/089,908 on Jan. 25, 2007, 11 pages.

USPTO, "Office Action," mailed in related U.S. Appl. No. 10/278,444 on Mar. 22, 2007, 23 pages.

Japanese Patent Office, "Office Action," mailed in related Patent Application No. 2007-027673 on Jun. 26, 2007, 4 pages.

USPTO, "Office Action," mailed in related Patent Application No. 09/759,119 on May 30, 2007, 4 pages.

USPTO, "Office Action," mailed in related U.S. Appl. No. 10/278,444 on Oct. 31, 2007, 28 pages.

USPTO, "Office Action," mailed in related U.S. Appl. No. 10/795,017 on Nov. 15, 2007, 5 pages.

USPTO, "Office Action," mailed in related U.S. Appl. No. 10/414,718 on Nov. 15, 2007, 5 pages.

USPTO, "Office Action," mailed in related U.S. Appl. No. 10/348,739 on Feb. 12, 2008, 10 pages.

USPTO, "Office Action," mailed in related U.S. Appl. No. 09/606,911 on Feb. 22, 2008, 22 pages.

Jex "Flash Memory BIOS for PC and Notebook Computers", 1991, IEEE, pp. 692-695.

Wilson, 1-Mbit Flash Memories Seek their role in System Design:, Computer Design, vol. 28, No. 5, pp. 30 and 32, Mar. 1989.

Bonner, "Flash Memory for Top Speeds in Mobile Computing Applications", Computer Technology Review, vol. 12, No. 7, Jun. 1992, pp. 36-37.

Williams, "Asymmetric Memory Hierarchies", Communications of the Association for Computing Machniery, vol. 16, No. 4, Apr. 1973, pp. 213-222.

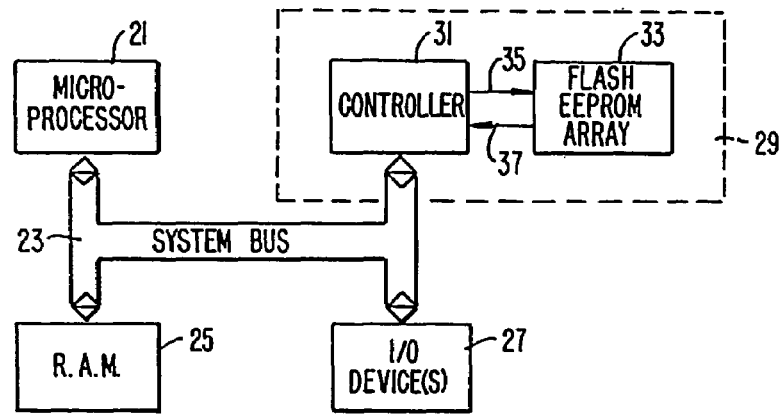
FIG._1A.
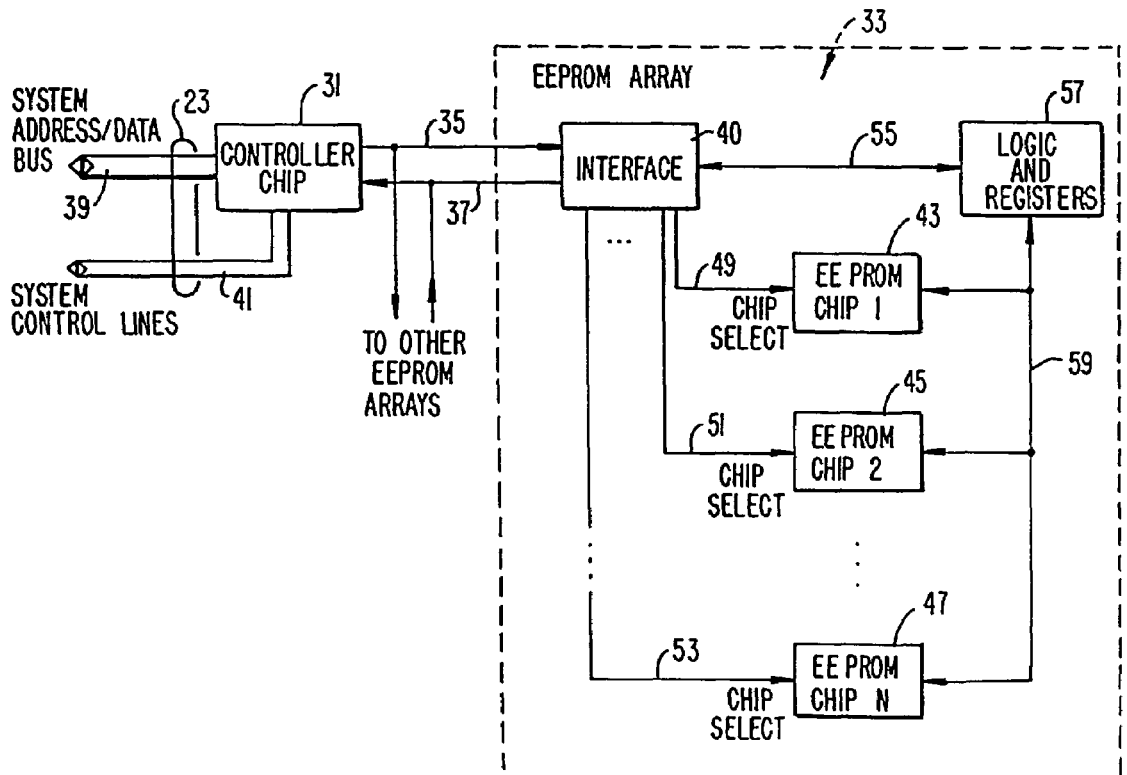
FIG._1B.

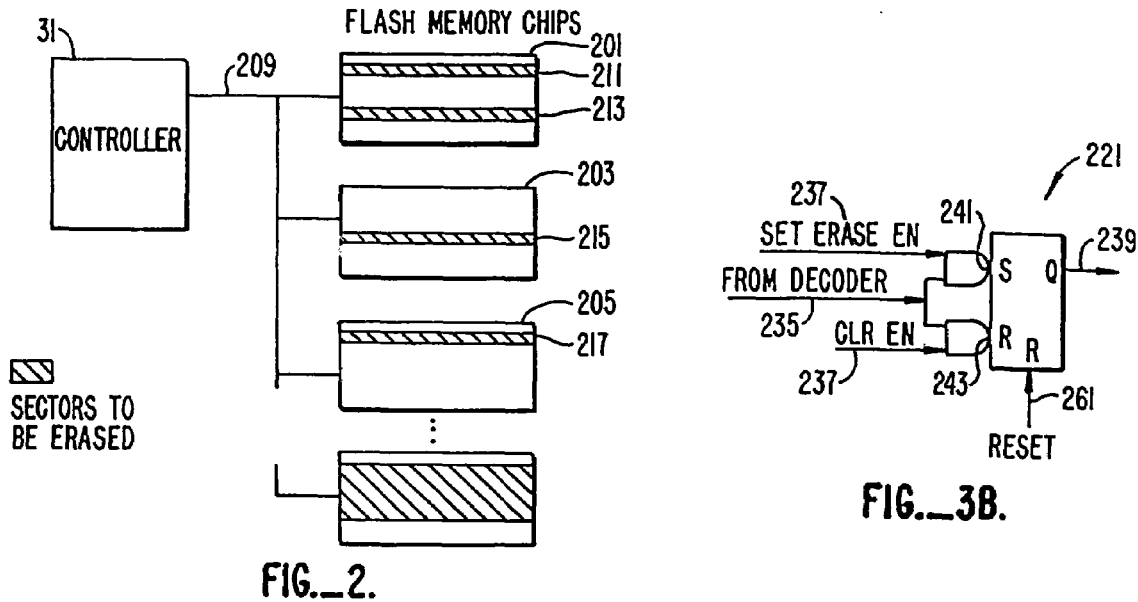
FIG._2.
FIG._3B.
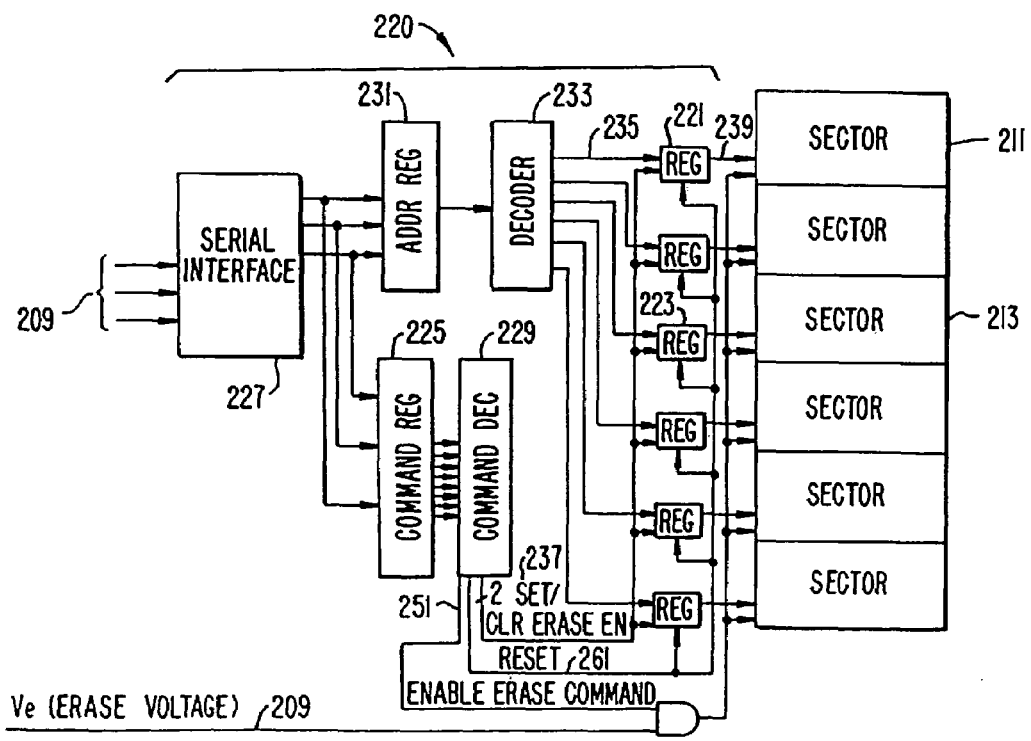
FIG._3A.

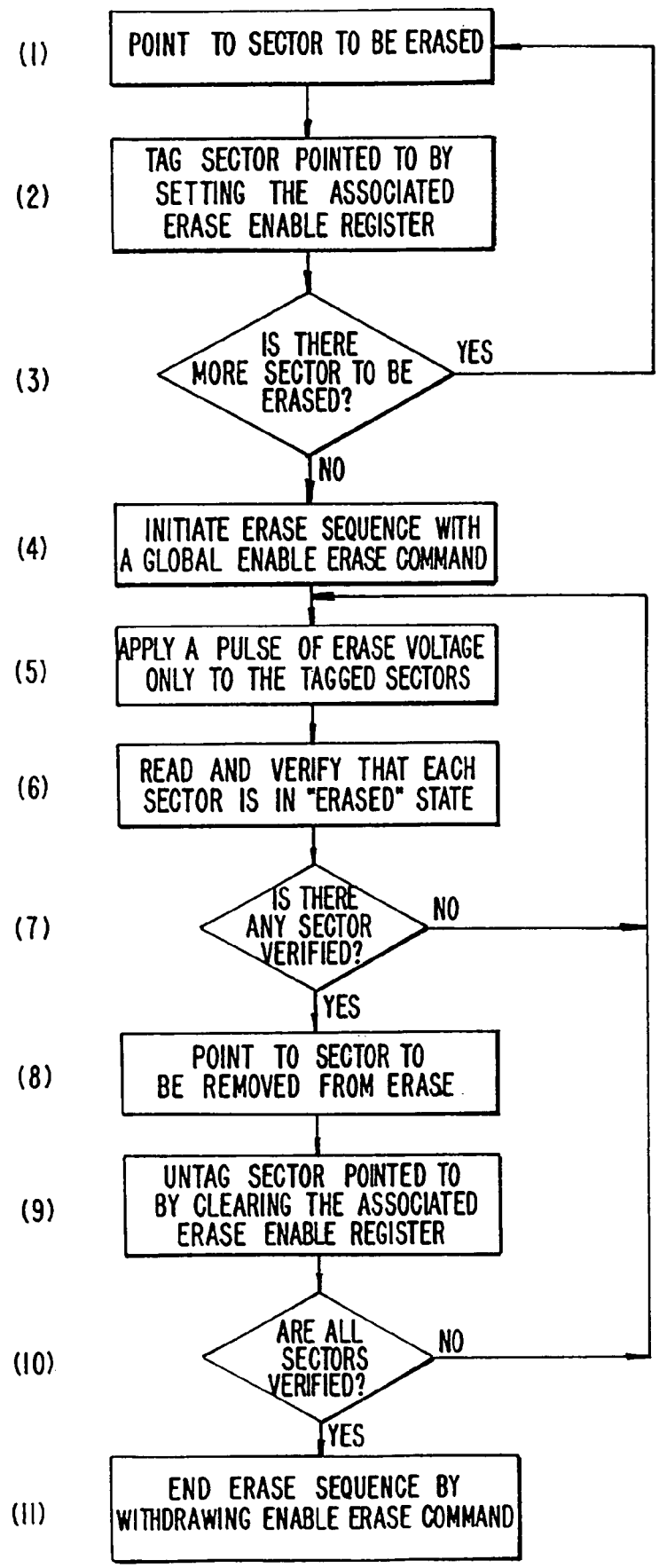
FIG._4.

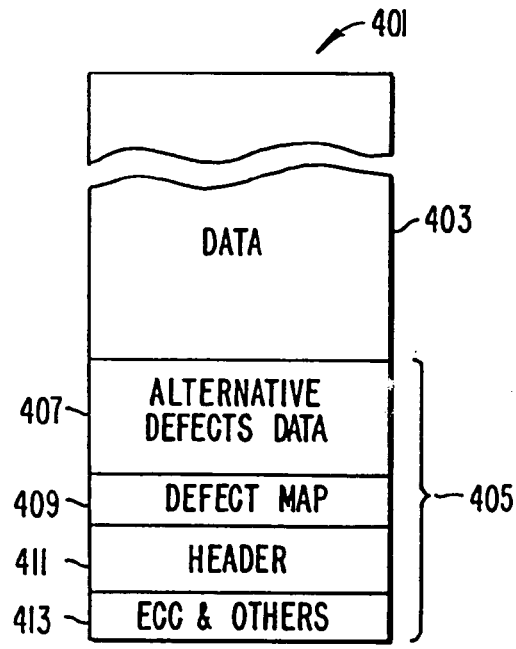
SECTOR PARTITION
FIG._5.
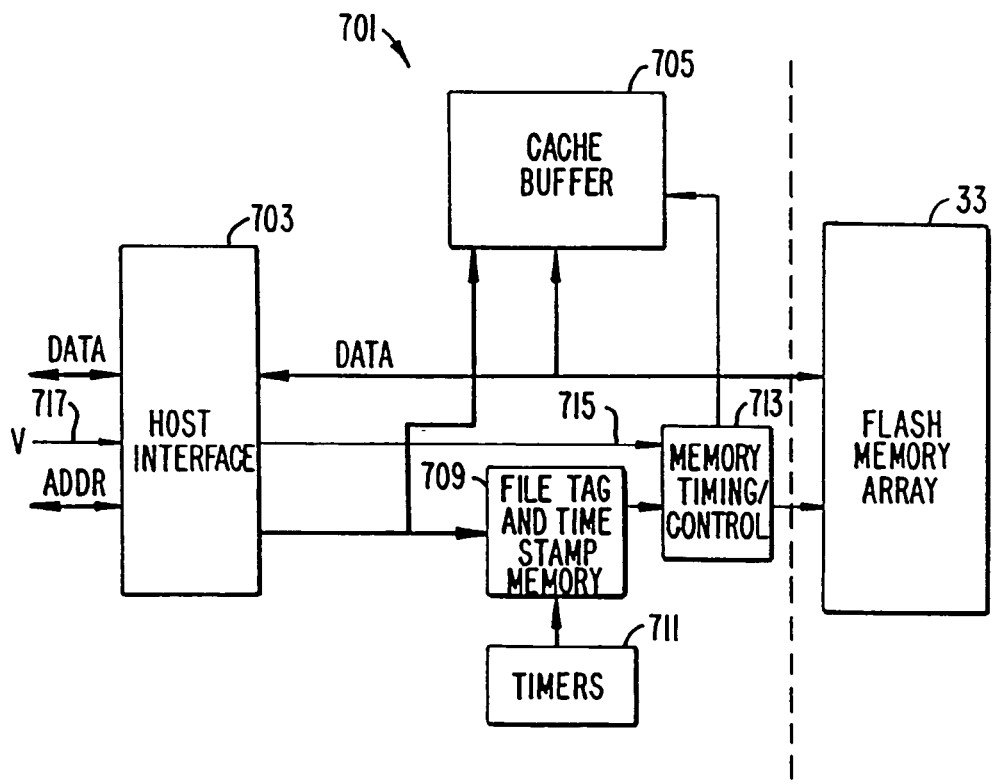
FIG._8.

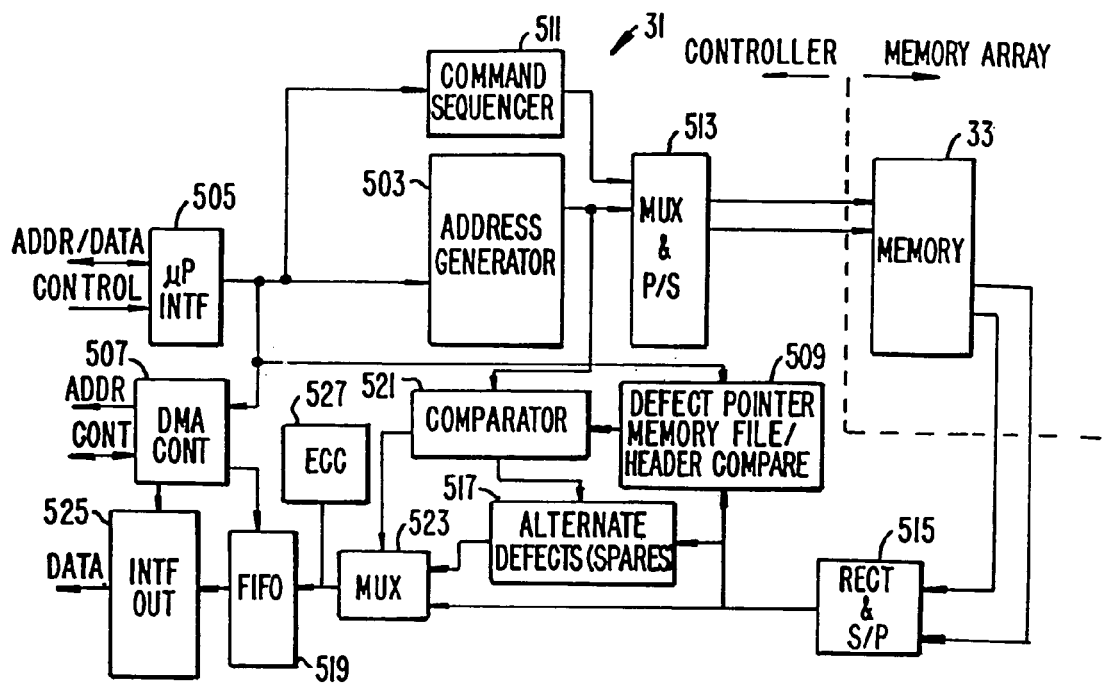
READ DATA PATH CONTROL
FIG._6.
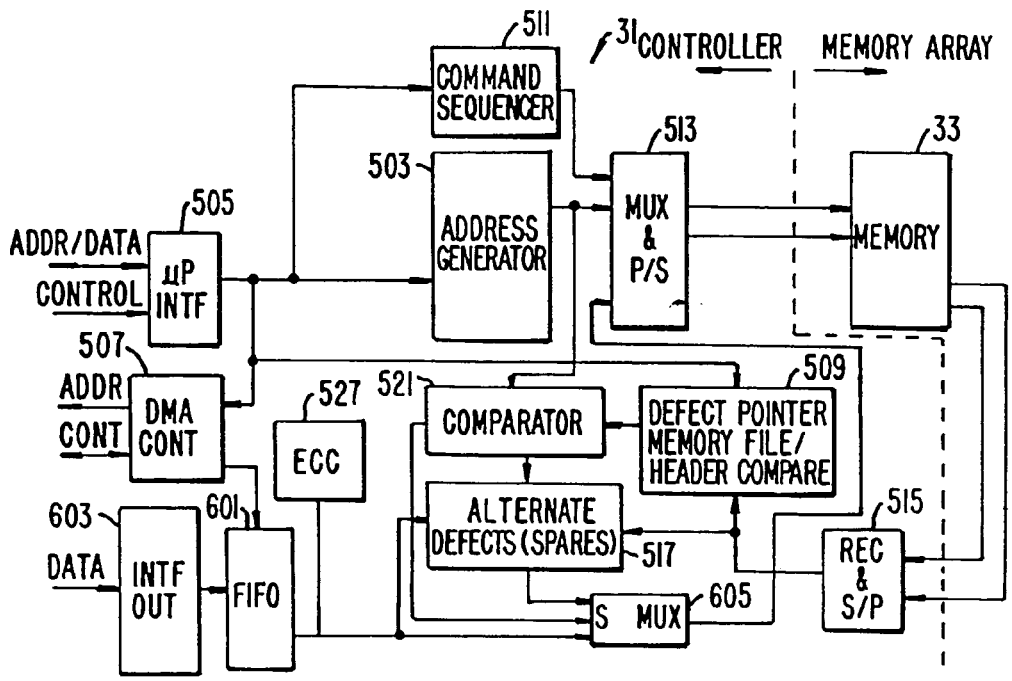
WRITE DATA PATH CONTROL
FIG._7.

FLASH EEPROM SYSTEM

CROSS-REFERENCE TO RELATED APPLICATIONS

This is a continuation of patent application Ser. No. 08/931,133, filed Sep. 16, 1997, now U.S. Pat. No. 5,936,971 which is a continuation of Ser. No. 08/249,049, filed May 25, 1994, now U.S. Pat. No. 5,671,229, which is a continuation of application Ser. No. 07/963,837, filed Oct. 20, 1992, now abandoned, which in turn is a division of patent application Ser. No. 07/337,566, filed Apr. 13, 1989, now abandoned.

BACKGROUND OF THE INVENTION

This invention relates generally to semiconductor electrically erasable programmable read only memories (EEprom), and specifically to a system of integrated circuit Flash EEprom chips.

Computer systems typically use magnetic disk drives for mass storage of data. However, disk drives are disadvantageous in that they are bulky and in their requirement for high precision moving mechanical parts. Consequently they are not rugged and are prone to reliability problems, as well as consuming significant amounts of power. Solid state memory devices such as DRAM's and SRAM's do not suffer from these disadvantages. However, they are much more expensive, and require constant power to maintain their memory (volatile). Consequently, they are typically used as temporary storage.

EEprom's and Flash EEprom's are also solid state memory devices. Moreover, they are nonvolatile, and retain their memory even after power is shut down. However, conventional Flash EEprom's have a limited lifetime in terms of the number of write (or program)/erase cycles they can endure. Typically the devices are rendered unreliable after $10^2$ to $10^3$ write/erase cycles. Traditionally, they are typically used in applications where semi-permanent storage of data or program is required but with a limited need for reprogramming.

Accordingly, it is an object of the present invention to provide a Flash EEprom memory system with enhanced performance and which remains reliable after enduring a large number of write/erase cycles.

It is another object of the present invention to provide an improved Flash EEprom system which can serve as non-volatile memory in a computer system.

It is another object of the present invention to provide an improved Flash EEprom system that can replace magnetic disk storage devices in computer systems.

It is another object of the present invention to provide a Flash EEprom system with improved erase operation.

It is another object of the present invention to provide a Flash EEprom system with improved error correction.

It is yet another object of the present invention to provide a Flash EEprom with improved write operation that minimizes stress to the Flash EEprom device.

It is still another object of the present invention to provide a Flash EEprom system with enhanced write operation.

SUMMARY OF THE INVENTION

These and additional objects are accomplished by improvements in the architecture of a system of EEprom chips, and the circuits and techniques therein.

According to one aspect of the present invention, an array of Flash EEprom cells on a chip is organized into sectors such that all cells within each sector are erasable at once. A Flash EEprom memory system comprises one or more Flash EEprom chips under the control of a controller. The invention allows any combination of sectors among the chips to be selected and then erased simultaneously. This is faster and more efficient than prior art schemes where all the sectors must be erased every time or only one sector at a time can be erased. The invention further allows any combination of sectors selected for erase to be deselected and prevented from further erasing during the erase operation. This feature is important for stopping those sectors that are first to be erased correctly to the "erased" state from over erasing, thereby preventing unnecessary stress to the Flash EEprom device. The invention also allows a global de-select of all sectors in the system so that no sectors are selected for erase. This global reset can quickly put the system back to its initial state ready for selecting the next combination of sectors for erase. Another feature of the invention is that the selection is independent of the chip select signal which enables a particular chip for read or write operation. Therefore it is possible to perform an erase operation on some of the Flash EEprom chips white read and write operations may be performed on other chips not involved in the erase operation.

According to another aspect of the invention, improved error correction circuits and techniques are used to correct for errors arising from defective Flash EEprom memory cells. One feature of the invention allows defect mapping at cell level in which a defective cell is replaced by a substitute cell from the same sector. The defect pointer which connects the address of the defective cell to that of the substitute cell is stored in a defect map. Every time the defective cell is accessed, its bad data is replaced by the good data from the substitute cell.

Another feature of the invention allows defect mapping at the sector level. When the number of defective cells in a sector exceeds a predetermined number, the sector containing the defective cells is replaced by a substitute sector.

An important feature of the invention allows defective cells or defective sectors to be remapped as soon as they are detected thereby enabling error correction codes to adequately rectify the relatively few errors that may crop up in the system.

According to yet another aspect of the present invention, a write cache is used to minimize the number of writes to the Flash EEprom memory. In this way the Flash EEprom memory will be subject to fewer stress inducing write/erase cycles, thereby retarding its aging. The most active data files are written to the cache memory instead of the Flash EEprom memory. Only when the activity levels have reduced to a predetermined level are the data files written from the cache memory to the Flash EEprom memory. Another advantage of the invention is the increase in write throughput by virtue of the faster cache memory.

According to yet another aspect of the present invention, one or more printed circuit cards are provided which contain controller and EEprom circuit chips for use in a computer system memory for long term, non-volatile storage, in place of a hard disk system, and which incorporate various of the other aspects of this invention alone and in combination.

Additional objects, features, and advantages of the present invention will be understood from the following description of its preferred embodiments, which description should be taken in conjunction with the accompanying drawings.

BRIEF DESCRIPTION OF THE DRAWINGS

FIG. 1A is a general micrprocessor system including the Flash EEprom memory system of the present invention;

FIG. 1B is schematic block diagram illustrating a system including a number of Flash EEprom memory chips and a controller chip;

FIG. 2 is a schematic illustration of a system of Flash EEprom chips, among which memory sectors are selected to be erased;

FIG. 3A is a block circuit diagram (in the controller for implementing selective multiple sector erase according to the preferred embodiment;

FIG. 3B shows details of a typical register used to select a sector for erase as shown in FIG. 2A;

FIG. 4 is a flow diagram illustrating the erase sequence of selective multiple sector erase;

FIG. 5 is a schematic illustration showing the partitioning of a Flash EEprom sector into a data area and a spare redundant area;

FIG. 6 is a circuit block diagram illustrating the data path control during read operation using the defect mapping scheme of the preferred embodiment;

FIG. 7 is a circuit block diagram illustrating the data path control during the write operation using the defect mapping scheme of the preferred embodiment;

FIG. 8 is a block diagram illustrating the write cache circuit inside the controller.

DESCRIPTION OF THE PREFERRED EMBODIMENTS

EEprom System

A computer system in which the various aspects of the present invention are incorporated is illustrated generally in FIG. 1A. A typical computer system architecture includes a microprocessor 21 connected to a system bus 23, along with random access, main system memory 25, and at least one or more input-output devices 27, such as a keyboard, monitor, modem, and the like. Another main computer system component that is connected to a typical computer system bus 23 is a large amount of long-term, non-volatile memory 29. Typically, such a memory is a disk drive with a capacity of tens of megabytes of data storage. This data is retrieved into the system volatile memory 25 for use in current processing, and can be easily supplemented, changed or altered.

One aspect of the present invention is the substitution of a specific type of semiconductor memory system for the disk drive but without having to sacrifice non-volatility, ease of erasing and rewriting data into the memory, speed of access, low cost and reliability. This is accomplished by employing an array of electrically erasable programmable read only memories (EEprom's) integrated circuit chips. This type of memory has additional advantages of requiring less power to operate, and of being lighter in weight than a hard disk drive magnetic media memory, thereby being especially suited for battery operated portable computers.

The bulk storage memory 29 is constructed of a memory controller 31, connected to the computer system bus 23, and an array 33 of EEprom integrated circuit chips. Data and instructions are communicated from the controller 31 to the EEprom array 33 primarily over a serial data line 35. Similarly, data and status signals are communicated from the EEprom 33 to the controller 31 over serial data lines 37. Other control and status circuits between the controller 31 and the EEprom array 33 are not shown in FIG. 1A.

Referring to FIG. 1B, the controller 31 is preferably formed primarily on a single integrated circuit chip. It is connected to the system address and data bus 39, part of the system bus 33, as well as being connected to system control lines 41, which include interrupt, read, write and other usual computer system control lines.

The EEprom array 33 includes a number of EEprom integrated circuit chips 43, 45, 47, etc. Each includes a respective chip select and enable line 49, 51 and 53 from interface circuits 40. The interface circuits 40 also act to interface between the serial data lines 35, 37 and a circuit 55. Memory location addresses and data being written into or read from the EEprom chips 43, 45, 47, etc. are communicated from a bus 55, through logic and register circuits 57 and thence by another bus 59 to each of the memory chips 43, 45, 47 etc.

The bulk storage memory 29 of FIGS. 1A and 1B can be implemented on a single printed circuit card for moderate memory sizes. The various lines of the system buses 39 and 41 of FIG. 1B are terminated in connecting pins of such a card for connection with the rest of the computer system through a connector. Also connected to the card and its components are various standard power supply voltages (not shown).

For large amounts of memory, that which is conveniently provided by a single array 33 may not be enough. In such a case, additional EEprom arrays can be connected to the serial data lines 35 and 37 of the controller chip 31, as indicated in FIG. 1B. This is preferably all done on a single printed circuit card but if space is not sufficient to do this, then one or more EEprom arrays may be implemented on a second printed circuit card that is physically mounted onto the first and connected to a common controller chip 31.

Erase of Memory Structures

In system designs that store data in files or blocks the data will need to be periodically updated with revised or new information. It may also be desirable to overwrite some no longer needed information, in order to accommodate additional information. In a Flash EEprom memory, the memory cells must first be erased before information is placed in them. That is, a write (or program) operation is always preceded by an erase operation.

In conventional Flash erase memory devices, the erase operation is done in one of several ways. For example, in some devices such as the Intel corporation's model 27F-256 CMOS Flash EEprom, the entire chip is erased at one time if not all the information in the chip is to be erased, the information must first be temporarily saved, and is usually written into another memory (typically RAM). The information is then restored into the nonvolatile Flash erase memory by programming back into the device. This is very slow and requires extra memory as holding space.

In other devices such as Seeq Technology Incorporated's model 48512 Flash EEprom chip, the memory is divided into blocks (or sectors) that, are each separately erasable, but only one at a time. By selecting the desired sector and going through the erase sequence the designated area is erased. While, the need for temporary memory is reduced, erase in various areas of the memory still requires a time consuming sequential approach.

In the present invention, the Flash EEprom memory is divided into sectors where all cells within each sector are erasable together. Each sector can be addressed separately and selected for erase. One important feature is the ability to select any combination of sectors for erase together. This will allow for a much faster system erase than by doing each one independently as in prior art.

FIG. 2 illustrates schematically selected multiple sectors for erase. A Flash EEprom system includes one or more Flash EEprom chips such as 201, 203, 205. They are in communication with a controller 31 through lines 209. Typically, the controller 31 is itself in communication with a microprocessor system (not shown). The memory in each Flash EEprom chip is partitioned into sectors where all memory cells within a sector are erasable together. For example, each sector may have 512 byte (i.e. 512×8 cells) available to the user, and a chip may have 1024 sectors. Each sector is individually addressable, and may be selected, such as sectors 211, 213, 215, 217 in a multiple sector erase. As illustrated in FIG. 2, the selected sectors may be confined to one EEprom chip or be distributed among several chips in a system. The sectors that were selected will all be erased together. This capability will allow the memory and system of the present invention to operate much faster than the prior art architectures.

FIG. 3A illustrates a block diagram circuit 220 on a Flash EEprom chip (such as the chip 201 of FIG. 2) with which one or more sectors such as 211, 213 are selected (or deselected) for erase. Essentially, each sector such as 211, 213 is selected or tagged by setting the state of an erase enable register such as 221, 223 associated with the respective sectors. The selection and subsequent erase operations are performed under the control of the controller 31 (see FIG. 2). The circuit 220 is in communication with the controller 31 through lines 209. Command information from the controller is captured in the circuit 220 by a command register 225 through a serial interface 227. It is then decoded by a command decoder 229 which outputs various control signals. Similarly, address information is captured by an address register 231 and is decoded by an address decoder 233.

For example, in order to select the sector 211 for erase, the controller sends the address of the sector 211 to the circuit 220. The address is decoded in line 235 and is used in combination with a set erase enable signal in bus 237 to set an output 239 of the register 221 to HIGH. This enables the sector 211 in a subsequent erase operation. Similarly, if the sector 213 is also desired to be erased, its associated register 223 may be set HIGH.

FIG. 3B shows the structure of the register such as 221, 223 in more detail. The erase enable register 221 is a SET/RESET latch. Its set input 241 is obtained from the set erase enable signal in bus 237 gated by the address decode in line 235. Similarly, the reset input 243 is obtained from the clear erase enable signal in bus 237 gated by the address decode in line 235. In this way, when the set erase enable signal or the clear erase enable signal is issued to all the sectors, the signal is effective only on the sector that is being addressed.

After all sectors intended for erase have been selected, the controller then issues to the circuit 220, as well as all other chips in the system a global erase command in line 251 along with the high voltage for erasing in line 209. The device will then erase all the sectors that have been selected (i.e. the sectors 211 and 213) at one time. In addition to erasing the desired sectors within a chip, the architecture of the present system permits selection of sectors across various chips for simultaneous erase.

FIGS. 4(1)-4(11) illustrate the algorithm used in conjunction with the circuit 220 of FIG. 3A. In FIG. 4(1), the controller will shift the address into the circuit 220 which is decoded in the line to the erase enable register associated with the sector that is to be erased. In FIG. 4(2), the controller shifts in a command that is decoded to a set erase enable command which is used to latch the address decode signal onto the erase enable register for the addressed sector. This tags the sector for subsequent erase. In FIG. 4(3), if more sectors are to be tagged, the operations described relative to FIGS. 4(1)-4(2) are repeated until all sectors intended for erase have been tagged. After all sectors intended for erase have been tagged, the controller initiates an erase cycle as illustrated in FIG. 4(4).

Optimized erase implementations have been disclosed in two copending U.S. patent applications. They are copending U.S. patent applications, Ser. No. 204,175, filed Jun. 8, 1988, by Dr. Eliyahou Haran, now U.S. Pat. No. 5,095,344, and one entitled "Multi-State EEprom Rea Write Circuits and Techniques", Ser. No. 07/337,579, filed Apr. 13, 1989, now abandoned, by Sanjay Mehrotra and Dr. Eliyahou Harari. The disclosures of the two applications are hereby incorporate by reference. The Flash EEprom cells are erased by applying a pulse of erasing voltage followed by a read to verify if the cells are erased to the "erased" state. If not, further pulsing and verifying are repeated until the cells are verified to be erased. By erasing in this controlled manner, the cells are not subject to over-erasure which tends to age the EEprom device prematurely as well as make the cells harder to program.

As the group of selected sectors is going through the erase cycle, some sectors will reach the "erase" state earlier than others. Another important feature of the present invention is the ability to remove those sectors that have been verified to be erased from the group of selected sectors, thereby preventing them from over-erasing.

Returning to FIG. 4(4), after all sectors intended for erase have been tagged, the controller initiates an erase cycle to erase the group of tagged sectors. In FIG. 4(5), the controller shifts in a global command called Enable Erase into each Flash EEprom chip that is to perform an erase. This is followed in FIG. 4(5) by the controller raising of the erase voltage line (Ve) to a specified value for a specified duration. The controller will lower this voltage at the end of the erase duration time. In FIG. 4(6), the controller will then do a read verify sequence on the sectors selected for erase. In FIG. 4(7), if none of the sectors are verified, the sequences illustrated in FIGS. 4(5)-4(7) are repeated. In FIGS. 4(8) and 3(9), if one or more sectors are verified to be erased, they are taken out of the sequence. Referring also to FIG. 3A, this is achieved by having the controller address each of the verified sectors and clear the associated erase enable registers back to a LOW with a clear enable command in bus 237. The sequences illustrated in FIGS. 4(5)-4(10) are repeated until all the sectors in the group are verified to be erased in FIG. 4(11). At the completion of the erase cycle, the controller will shift in a No Operation (NOP) command and the global Enable Erase command will be withdrawn as a protection against a false erasure.

The ability to select which sectors to erase and which ones not to, as well as which ones to stop erasing is advantageous. It will allow sectors that have erased before the slower erased sectors to be removed from the erase sequence so no further stress on the device will occur. This will increase the reliability of the system. Additional advantage is that if a sector is bad or is not used for some reason, that sector can be skipped over with no erase occurring within that sector. For example, if a sector is defective and have shorts in it, it may consume much power. A significant system advantage is gained by the present invention which allows it to be skipped on erase cycles so that it may greatly reduce the power required to erase the chip.

Another consideration in having the ability to pick the sectors to be erased within a device is the power savings to the system. The flexibility in erase configuration of the present invention enables the adaptation of the erase needs to the power capability of the system. This can be done by configuring the systems to be erased differently by software on a fixed basis between different systems. It also will allow the controller to adaptively change the amount of erasing being done by monitoring the voltage level in a system, such as a laptop computer.

An additional performance capability of the system in the present invention is the ability to issue a reset command to a Flash EEprom chip which will clear all erase enable latches and will prevent any further erase cycles from occurring. This is illustrated in FIGS. 2A and 2B by the reset signal in the line 261. By doing this in a global way to all the chips, less time will be taken to reset all the erase enable registers.

An additional performance capability is to have the ability to do erase operations without regard to chip select. Once an erase is started in some of the memory chips, the controller in the system can access other memory chips and do read and write operations on them. In addition, the device(s) doing the erase can be selected and have an address loaded for the next command following the erase.

Defect Mapping

Physical defects in memory devices give rise to hard errors. Data becomes corrupted whenever it is stored in the defective cells. In conventional memory devices such as RAM's and Disks, any physical defects arising from the manufacturing process are corrected at the factory. In RAM'S, spare redundant memory cells on chip may be patched on, in place of the defective cells. In the traditional disk drive, the medium is imperfect and susceptible to defects. To overcome this problem manufacturers have devised various methods of operating with these defects present, the most usual being defect mapping of sectors. In a normal disk system the media is divided into cylinders and sectors. The sector being the basic unit in which data is stored. When a system is partitioned into the various sectors the sectors containing the defects are identified and are marked as bad and not to be used by the system. This is done in several ways. A defect map table is stored on a particular portion of the disk to be used by the interfacing controller. In addition, the bad sectors are marked as bad by special ID and flag markers. When the defect is addressed, the data that would normally be stored there is placed in an alternative location. The requirement for alternative sectors makes the system assign spare sectors at some specific interval or location. This reduces the amount of memory capacity and is a performance issue in how the alternative sectors are located.

One important application of the present invention is to replace a conventional disk storage device with a system incorporating an array of Flash EEprom memory chips. The EEprom system is preferably set up to emulate a conventional disk, and may be regarded as a "solid-state disk".

In a "disk" system made from such solid-state memory devices, low cost considerations necessitate efficient handling of defects. Another important feature of the invention enables the error correction scheme to conserve as much memory as possible. Essentially, it calls for the defective cells to be remapped cell by cell rather than by throwing away the whole sector (512 bytes typically) whenever a defect occurs in it. This scheme is especially suited to the Flash EEprom medium since the majority of errors will be bit errors rather than a long stream of adjacent defects as is typical in traditional disk medium.

In both cases of the prior art RAM and magnetic disk, once the device is shipped from the factory, there is little or no provision for replacing hard errors resulting from physical defects that appear later during normal operation. Error corrections then mainly rely on schemes using error correction codes (ECC).

The nature of the Flash EEprom device predicates a higher rate of cell failure especially with increasing program/erase cycling. The hard errors that accumulate with use would eventually overwhelm the ECC and render the device unusable. One important feature of the present invention is the ability for the system to correct for hard errors whenever they occur. Defective cells are detected by their failure to program or erase correctly. Also during read operation, defective cells are detected and located by the ECC. As soon as a defective cell is identified, the controller will apply defect mapping to replace the defective cell with a space cell located usually within the same sector. This dynamic correction of hard errors, in addition to conventional error correction schemes, significantly prolongs the life of the device.

Another feature of the present invention is an adaptive approach to error correction. Error correction code (ECC) is employed at all times to correct for soft errors as well as any hard errors that may arise. As soon as a hard error is detected, defect mapping is used to replace the defective cell with a spare cell in the same sector block. Only when the number of defective cells in a sector exceeds the defect mapping's capacity for that specific sector will the whole sector be replaced as in a conventional disk system. This scheme minimized wastage without compromising reliability.

FIG. 5 illustrates the memory architecture for the cell remapping scheme. As described before, the Flash EEprom memory is organized into sectors where the cells in each sector are erasable together. The memory architecture has a typical sector 401 organized into a data portion 403 and a spare (or shadow) portion 405. The data portion 403 is memory space available to the user. The spare portion 405 is further organized into an alternative defects data area 407, a defect map area 409, a header area 411 and an ECC and others area 413. These areas contain information that could be used by the controller to handle the defects and other overhead information such as headers and ECC.

Whenever a defective cell is detected in the sector, a good cell in the alternative defects data area 407 is assigned to backup the data designated for the defective cell. Thus even if the defective cell stores the data incorrectly, an error-free copy is stored in the backup cell. The addresses of the defective cell and the backup cell are stored as defect pointers in the defect map 409.

It is to be understood that the partitioning between the user data portion 403 and the spare portion 405 need not be rigid. The relative size of the various partitioned areas may be logically reassigned. Also the grouping of the various areas is largely for the purpose of discussion and not necessarily physically so. For example, the alternative defects data area 407 has been schematically grouped under the spare portion 405 to express the point that the space it occupies is no longer available to the user.

In a read operation, the controller first reads the header, the defect map and the alternative defects data. It then reads the actual data. It keeps track of defective cells and the location of the substitute data by means of the defect map. Whenever a defective cell is encountered, the controller substitutes its bad data with the good data from the alternative defects.

FIG. 6 illustrates the read data path control in the preferred embodiment. A memory device 33 which may include a plurality of Flash EEprom chips is under the control of the controller 31. The controller 31 is itself part of a microcomputer system under the control of a microprocessor (not shown). To initiate the reading of a sector, the microprocessor loads a memory address generator 503 in the controller with a memory address for starting the read operation. This information is loaded through a microprocessor interface port 505. Then the microprocessor loads a DMA controller 507 with the starting location in buffer memory or bus address that the data read should be sent. Then the microprocessor loads the header information (Head, Cylinder and sector) into a holding register file 509. Finally, the microprocessor loads a command sequencer 511 with a read command before passing control to the controller 31.

After assuming control, the controller 31 first addresses the header of the sector and verifies that the memory is accessed at the address that the user had specified. This is achieved by the following sequence. The controller selects a memory chip (chip select) among the memory device 33 and shifts the address for the header area from the address generator 503 out to the selected memory chip in the memory device 33. The controller then switches the multiplexer 513 and shifts also the read command out to the memory device 33. Then the memory device reads the address sent it and begins sending serial data from the addressed sector back to the controller. A receiver 515 in the controller receives this data and puts it in parallel format. In one embodiment, once a byte (8 bits) is compiled, the controller compares the received data against the header data previously stored by the microprocessor in the holding register file 509. If the compare is correct, the proper location is verified and the sequence continues.

Next the controller 31 reads the defect pointers and loads these bad address locations into the holding register file 509. This is followed by the controller reading the alternative defects data that were written to replace the bad bits as they were written. The alternative bits are stored in an alternative defects data file 517 that will be accessed as the data bits are read.

Once the Header has been determined to be a match and the defect pointers and alternative bits have been loaded, the controller begins to shift out the address of the lowest address of the desired sector to be read. The data from the sector in the memory device 33 is then shifted into the controller chip 31. The receiver 515 converts the data to a parallel format and transfers each byte into a temporary holding FIFO 519 to be shipped out of the controller.

A pipeline architecture is employed to provide efficient throughput as the data is gated through the controller from the receiver 515 to the FIFO 519. As each data bit is received from memory the controller is comparing the address of the data being sent (stored in the address generator 507) against the defect pointer map (stored in the register file 509). If the address is determined to be a bad location, by a match at the output of the comparator 521, the bad bit from the memory received by the receiver 515 is replaced by the good bit for that location. The good bit is obtained from the alternative defects data file 517. This is done by switching the multiplexer 523 to receive the good bit from the alternative defects data file instead of the bad bit from the receiver 515, as the data is sent to the FIFO 519. Once the corrected data is in the FIFO it is ready to be sent to buffer memory or system memory (not shown). The data is sent from the controller's FIFO 519 to the system memory by the controller's DMA controller 507. This controller 507 then requests and gets access to the system bus and puts out an address and gates the data via an output interface 525 out to the system bus. This is done as each byte gets loaded into the FIFO 519. As the corrected data is loaded into the FIFO it will also be gated into an ECC hardware 527 where the data file will be acted on by the ECC.

Thus in the manner described, the data read from the memory device 33 is gated through the controller 31 to be sent to the system. This process continues until the last bit of addressed data has been transferred.

In spite of defect mapping of previously detected defective cells, new hard errors might occur since the last mapping. As the dynamic defect mapping constantly "puts away" new defective cells, the latest hard error that may arise between defect mapping would be adequately handled by the ECC. As the data is gated through the controller 31, the controller is gating the ECC bits into the ECC hardware 527 to determine if the stored value matched the just calculated remainder value. If it matches then the data transferred out to the system memory was good and the read operation was completed. However, if the ECC registers an error then a correction calculation on the data sent to system memory is performed and the corrected data re-transmitted. The method for calculating the error can be done in hardware or software by conventional methods. The ECC is also able to calculate and locate the defective cell causing the error. This may be used by the controller 31 to update the defect map associated with the sector in which the defective cell is detected. In this manner, hard errors are constantly removed from the Flash EEprom system.

FIG. 7 illustrates the write data path control in the preferred embodiment. The first portion of a write sequence is similar to a read sequence described previously. The microprocessor first loads the Address pointers for the memory device 33 and the DMA as in the read sequence. It also loads the header desired into the address generator 503 and the command queue into the command sequencer 511. The command queue is loaded with a read header command first. Thereafter, control is passed over to the controller 31. The controller then gates the address and command to the memory device 33, as in the read sequence. The memory device returns header data through controller's receiver 515. The controller compares the received header data to the expected value (stored in the holding register file 509). If the compare is correct, the proper location is verified and the sequence continues. Then the controller loads the defective address pointers from the memory device 33 into the holding register file 509 and the alternative data into the alternative defects data file 517.

Next, the controller begins to fetch the write data from system memory (not shown). It does this by getting access to the system bus, outputs the memory or bus address and does the read cycle. It pulls the data into a FIFO 601 through an input interface 603. The controller then shifts the starting sector address (lowest byte address) from the address generator 503 to the selected memory device 33. This is followed by data from the FIFO 601. These data are routed through multiplexers 605 and 513 and converted to serial format before being sent to the memory device 33. This sequence continues until all bytes for a write cycle have been loaded into the selected memory.

A pipeline architecture is employed to provide efficient throughput as the data is gated from the FIFO 601 to the selected memory 33. The data gated out of the FIFO 601 is sent to the ECC hardware 527 where a remainder value will be calculated within the ECC. In the next stage, as the data is being sent to the memory device through multiplexers 605 and 513, the comparator 521 is comparing its address from the address generator 503 to the defect pointer address values in the holding register file 509. When a match occurs, indicating that a defective location is about to be written, the controller saves this bit into the alternative defect data file 517. At the same time, all bad bits sent to memory will be sent as zeroes.

After the bytes for a write cycle have been loaded into the selected memory device, the controller issues a program command to the memory device and initiate a write cycle. Optimized implementations of write operation for Flash EEprom device have been disclosed in two previously cited co-pending U.S. patent applications, Ser. No. 204,175 now U.S. Pat. No. 5,095,344, and one entitled "Multi-State EErm Read and Write Circuits and Techniques", Ser. No. 07/337,579, filed Apr. 13, 1989, now abandoned. Relevant portions of the disclosures are hereby incorporated by reference. Briefly, during the write cycle, the controller applies a pulse of programming (or writing) voltages. This is followed by a verify read to determine if all the bits have been programmed properly. If the bits did not verify, the controller repeats the program/verify cycle until all bits are correctly programmed.

If a bit fails to verify after prolonged program/verify cycling, the controller will designate that bit as defective and update the defect map accordingly. The updating is done dynamically, as soon as the defective cell is detected. Similar actions are taken in the case of failure in erase verify.

After all the bits have been programmed and verified, the controller loads the next data bits from the FIFO 601 and addresses the next location in the addressed sector. It then performs another program/verify sequence on the next set of bytes. The sequence continues until the end of the data for that sector. Once this has occurred, the controller addresses the shadow memory (header area) associated with the sector (see FIG. 5) and writes the contents of the ECC registers into this area.

In addition, the collection of bits that was flagged as defective and were saved in the alternative defects data file 516 is then written in memory at the alternative defects data locations (see FIG. 5), thereby saving the good bit values to be used on a subsequent read. Once these data groups are written and verified, the sector write is considered completed.

The present invention also has provision for defect mapping of the whole sector, but only after the number of defective cells in the sector has exceeded the cell defect mapping's capacity for that specific sector. A count is kept of the number of defective cells in each sector. When the number in a sector exceeds a predetermined value, the controller marks that sector as defective and maps it to another sector. The defect pointer for the linked sectors may be stored in a sector defect map. The sector defect map may be located in the original defective sector if its spare area is sufficiently defect-free. However, when the data area of the sector has accumulated a large number of defects, it is quite likely that the spare area will also be full of defects.

Thus, it is preferable in another embodiment to locate the sector map in another memory maintained by the controller. The memory may be located in the controller hardware or be part of the Flash EEprom memory. When the controller is given an address to access data, the controller compares this address against the sector defect map. If a match occurs then access to the defective sector is denied and the substitute address present in the defect map is entered, and the corresponding substitute sector is accessed instead.

In yet another embodiment, the sector remapping is performed by the microprocessor. The microprocessor looks at the incoming address and compares it against the sector defect map. If a match occurs, it does not issue the command to the controller but instead substitute the alternative location as the new command.

Apart from the much higher speed of the solid-state disk, another advantage is the lack of mechanical parts. The long seek times, rotational latency inherent in disk drives are not present. In addition, the long synchronization times, sync mark detects and write gaps are not required. Thus the overhead needed for accessing the location where data is to be read or written is much less. All of these simplifications and lack of constraints result in a much faster system with much reduced overheads. In addition, the files can be arranged in memory in any address order desired, only requiring the controller to known how to get at the data as needed.

Another feature of the invention is that defect mapping is implemented without the need to interrupt the data stream transferred to or from the sector. The data in a block which may contain errors are transferred regardless, and is corrected afterwards. Preserving the sequential addressing will result in higher speed by itself. Further, it allows the implementation of an efficient pipeline architecture in the read and write data paths.

Write Cache System

Cache memory is generally used to speed up the performance of systems having slower access devices. For example in a computer system, access of data from disk storage is slow and the speed would be greatly improved if the data could be obtained from the much faster RAM. Typically a part of system RAM is used as a cache for temporarily holding the most recently accessed data from disk. The next time the data is needed, it may be obtained from the fast cache instead of the slow disk. The scheme works well in situations where the same data is repeatedly operated on. This is the case in most structures and programs since the computer tends to work within a small area of memory at a time in running a program. Another example of caching is the using of faster SRAM cache to speed up access of data normally stored in cheaper but slower DRAM.

Most of the conventional cache designs are read caches for speeding up reads from memory. In some cases, write caches are used for speeding up writes to memory. However in the case of writes to system memory (e.g. disks), data is still being written to system memory directly every time they occur, while being written into cache at the same time. This is done because of concern for loss of updated data files in case of power loss. If the write data is only stored in the cache memory (volatile) a loss of power will result in the new updated files being lost from cache before having the old data updated in system memory (non-volatile). The system will then be operating on the old data when these files are used in further processing. The need to write to main memory every time defeats the caching mechanism for writes. Read caching does not have this concern since the data that could be lost from cache has a backup on disk.

In the present invention, a system of Flash EEprom is used to provide non-volatile memory in place of traditional system memories such as disk storage. However, Flash EEprom memory is subject to wearing out by excessive program/erase cycles. Even with the improved Flash EEprom memory device as disclosed in co-pending U.S. patent applications, Ser. No. 204,175 now U.S. Pat. No. 5,095,344, and Haran, Ser. No. 07/337,579, filed Apr. 13, 1989, now abandoned, by Sanjay Mehrotra and Dr. Eliyahou Harari filed on the same day as the present application, the endurance limit is approximately $10^6$ program/erase cycles. In a ten-year projected life time of the device, this translates to a limit of one program/erase cycle per 5 minutes. This may be marginal in normal computer usage.

To overcome this problem, a cache memory is used in a novel way to insulate the Flash EEprom memory device from enduring too many program/erase cycles. The primary function of the cache is to act on writes to the Flash EEprom memory and not on reads of the Flash EEprom memory, unlike the case with traditional caches. Instead of writing to the Flash EEprom memory every time the data is updated, the data may be operated on several times in the cache before being committed to the Flash EEprom memory. This reduces the number of writes to the Flash EEprom memory. Also, by writing mostly into the faster cache memory and reducing the number of writes to the slower Flash EEprom, an additional benefit is the increase in system write throughput.

A relatively small size cache memory is quite effective to implement the present invention. This helps to overcome the problem of data loss in the volatile cache memory during a power loss. In that event, it is relatively easy to have sufficient power reserve to maintain the cache memory long enough and have the data dumped into a non-volatile memory such as a specially reserved space in the Flash EEprom memory. In the event of a power down or and power loss to the system, the write cache system may be isolated from the system and a dedicated rechargeable power supply may be switch in only to power the cache system and the reserved space in the Flash EEprom memory.

FIG. 8 illustrates schematically a cache system 701 as part of the controller, according to the present invention. On one hand the cache system 701 is connected to the Flash EEprom memory array 33. On the other hand it is connected to the microprocessor system (not shown) through a host interface 703. The cache system 701 has two memories. One is a cache memory 705 for temporarily holding write data files. The other is a tag memory 709 for storing relevant information about the data files held in the cache memory 705. A memory timing/control circuit 713 controls the writing of data files from the cache memory 705 to the Flash EEprom memory 33. The memory control circuit 713 is responsive to the information stored in the tag memory as well as a power sensing input 715 with is connected through the host interface 703 via a line 717 to the power supply of the microprocessor system. A power loss in the microprocessor system will be sensed by the memory control circuit 713 which will then down load all the data files in the volatile cache memory 705 to the non-volatile Flash EEprom memory 33.

In the present invention, the Flash EEprom memory array 33 is organized into sectors (typically 512 byte size) such that all memory cells within each sector are erasable together. Thus each sector may be considered to store a data file and a write operation on the memory array acts on one or more such files.

During read of a new sector in the Flash EEprom memory 33, the data file is read out and sent directly to the host through the controller. This file is not used to fill the cache memory 705 as is done in the traditional cache systems.

After the host system has processed the data within a file and wishes to write it back to the Flash EEprom memory 33, it accesses the cache system 701 with a write cycle request. The controller then intercepts this request and acts on the cycle.

In one embodiment of the invention, the data file is written to the cache memory 705. At the same time, two other pieces of information about the data file are written to a tag memory 709. The first is a file pointer which identifies the file present in the cache memory 705. The second is a time stamp that tells what time the file was last written into the cache memory. In this way, each time the host wishes to write to the Flash EEprom memory 33, the data file is actually first stored in the cache memory 705 along with pointers and time stamps in the tag memory 709.

In another embodiment of the invention, when a write from the host occurs, the controller first checks to see if that file already existed in the cache memory 705 or has been tagged in the tag memory 709. If it has not been tagged, the file is written to the Flash memory 33, while its identifier and time stamp are written to the tag memory 709. If the file already is present in the cache memory or has been tagged, it is updated in the cache memory and not written to the Flash memory. In this way only infrequently used data, files are written into the Flash memory while frequently used data files are trapped in the cache memory.

In yet another embodiment of the invention, when a write from the host occurs, the controller first checks to see if that data file has been last written anywhere within a predetermined period of time (for example, 5 minutes). If it has not, the data file is written to the Flash memory 33, while its identifier and time stamp are written to the tag memory 709. If the data file has been last written within the predetermined period of time, it is written into the cache memory 705 and not written to the Flash memory. At the same time, its identifier and time stamp are written to the tag memory 709 as in the other embodiments. In this way also, only infrequently used data files are written into the Flash memory while frequently used data files are trapped in the cache memory.

In all embodiments, over time the cache memory 705 will start to fill up. When the controller has detected that some predetermined state of fullness has been reached, it begins to archive preferentially some files over others in the cache memory 705 by writing them to the Flash memory 33.

In either embodiments, over time the cache memory 705 will start to fill up. When the controller has detected that some predetermined state of fullness has been reached, it begins to archive preferentially some files over others in the cache memory 705 by writing them to the Flash memory 33. The file identifier tag bits for these files are then reset, indicating that these files may be written over. This makes room for new data files entering the cache memory.

The controller is responsible for first moving the least active files back into the Flash memory 33 to make room for new active files. To keep track of each file's activity level, the time stamp for each file is incremented by the controller at every time step unless reset by a new activity of the file. The timing is provided by timers 711. At every time step (count), the controller systematically accesses each data file in the cache memory and reads the last time stamp written for this data file. The controller then increments the time stamp by another time step (i.e. increments the count by one).

Two things can happen to a file's time stamp, depending on the activity of the file. One possibility is for the time stamp to be reset in the event of a new activity occurring. The other possibility is that no new activity occurs for the file and the time stamp continues to increment until the file is removed from the cache. In practice a maximum limit may be reached if the time stamp is allowed to increase indefinitely. For example, the system may allow the time stamp to increment to a maximum period of inactivity of 5 minutes. Thus, when a data file is written in the cache memory, the time stamp for the file is set at its initial value. Then the time stamp will start to age, incrementing at every time step unless reset to its initial value again by another write update. After say, 5 minutes of inactivity, the time stamp has incremented to a maximum terminal count.

In one embodiment of keeping count, a bit can be shifted one place in a shift register each time a count increment for a file occurs. If the file is updated (a new activity has occurred) the bit's location will be reset to the initial location of the shift register. On the other hand, if the file remains inactive the bit will eventually be shifted to the terminal shift position. In another embodiment, a count value for each file is stored and incremented at each time step. After each increment, the count value is compared to a master counter, the difference being the time delay in question.

Thus, if a file is active its incremented time stamp is reset back to the initial value each time the data file is rewritten. In this manner, files that are constantly updated will have low time stamp identifiers and will be kept in cache until their activity decreases. After a period of inactivity has expired, they acquire the maximum time stamp identifiers. The inactive files are eventually archived to the Flash memory freeing space in the cache memory for new, more active files. Space is also freed up in the tag memory when these inactive files are moved to the Flash memory.

At any time when room must be made available for new data files coming into the cache memory, the controller removes some of the older files and archives them to the Flash memory 33. Scheduling is done by a memory timing/control circuit 713 in the controller. The decision to archive the file is based on several criteria. The controller looks at the frequency of writes occurring in the system and looks at how full the cache is. If there is still room in the cache, no archiving need to be done. If more room is needed, the files with the earliest time stamps are first removed and archived to the Flash memory.

Although the invention has been described with implementation in hardware in the controller, it is to be understood that other implementations are possible. For example, the cache system may be located elsewhere in the system, or be implemented by software using the existing microprocessor system. Such variations are within the scope of protection for the present invention.

The Profile of how often data is written back to the Flash memory is determined by several factors. It depends on the size of the cache memory and the frequency of writes occurring in the system. With a small cache memory system, only the highest frequency files will be cached. Less frequently accessed files will also be cached with increasing cache memory size. In the present invention, a relatively cheap and small amount of cache memory, preferably about 1 Mbyte, may be used to good advantage. By not constantly writing the most active files (the top 5%), the write frequency of the Flash EEprom may be reduced from the usual one every millisecond to one every 5 minutes. In this way the wear-out time for the memory can be extended almost indefinitely. This improvement is also accompanied by increased system performance during write.

Incorporating time tag into the write cache concept has the advantage that the size of the write cache buffer memory can be relatively small, since it is used only to store frequently written data files, with all other files written directly into the Flash EEprom memory. A second advantage is that the management of moving data files in and out of the write cache buffer can be automated since it does not require advanced knowledge of which data files are to be called next.

The various aspects of the present invention that have been described co-operate in a system of Flash EEprom memory array to make the Flash EEprom memory a viable alternative to conventional non-volatile mass storage devices.

While the embodiments of the various aspects of the present invention that have been described are the preferred implementation, those skilled in the art will understand that variations thereof may also be possible. Therefore, the invention is entitled to protection within the full scope of the appended claims.

The invention claimed is:

1. In memory system that includes an array of non-volatile floating gate memory cells partitioned into a plurality of sectors that individually include a distinct group of said array of memory cells that are erasable together as a unit, a method of operating the memory system with a host computer, comprising:

configuring use of the memory cells within the individual sectors to provide at least distinct portions in which user data and a sector address are stored, in response to receiving a memory address from the host computer, addressing a corresponding sector and reading the sector address from the sector address portion thereof, if the read sector address is that of the addressed corresponding sector, sending data to the host computer that is read from the user data portion of the addressed corresponding sector, and if the read sector address is that of a sector other than the addressed corresponding sector, addressing the other sector and sending data to the host computer that is read from the user data portion of the other sector.

2. The method of claim 1, wherein the memory array is operated with the individual cells thereof being programmable into one of exactly two detectable states in order to store one bit of data per cell.

3. The method of claim 1, wherein the memory array is operated with the individual cells thereof being programmable into one of more than two detectable states in order to store more than one bit of data per cell.

4. The method of any one of claims 1-3, additionally comprising providing the memory array within a card that is removably connectable to the host computer system.

5. The method of any one of claims 1-3, wherein the user data portion of the individual memory sectors has a capacity of 512 bytes of data.

* * * * *